(12) United States Patent
Takeuchi et al.

(10) Patent No.: US 7,837,027 B2
(45) Date of Patent: Nov. 23, 2010

(54) WORKPIECE TRANSPORTING APPARATUS AND ELECTRONIC COMPONENT TRANSPORTING APPARATUS

(75) Inventors: Satoru Takeuchi, Echizen (JP); Yoshikazu Sasaoka, Toyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 12/276,107

(22) Filed: Nov. 21, 2008

(65) Prior Publication Data

US 2009/0127070 A1 May 21, 2009

Related U.S. Application Data

(63) Continuation of application No. PCT/JP2007/059363, filed on May 2, 2007.

(30) Foreign Application Priority Data

Jun. 2, 2006 (JP) .............................. 2006-154482

(51) Int. Cl.
   *B65G 25/00* (2006.01)
   *B65G 29/00* (2006.01)
   *B65G 47/22* (2006.01)
(52) U.S. Cl. .................................... 198/689.1; 198/493
(58) Field of Classification Search .............. 198/689.1, 198/493
   See application file for complete search history.

(56) References Cited

U.S. PATENT DOCUMENTS 5,842,579 A * 12/1998 Garcia et al. ................. 209/573
6,479,777 B2 * 11/2002 Yamakawa ................... 209/574
6,906,508 B1 * 6/2005 Saulnier et al. .......... 324/158.1
2002/0050443 A1    5/2002 Kurabe et al.
2004/0145103 A1 *  7/2004 Kojima et al. .................. 269/21

FOREIGN PATENT DOCUMENTS

| JP | 3110024    | 12/1991 |
| JP | 9-150387   | 6/1997  |
| JP | 9150387    | 10/1997 |
| JP | 2002-68471 | 3/2002  |

(Continued)

OTHER PUBLICATIONS

International Search Report issued Jul. 3, 2007.

(Continued)

*Primary Examiner*—Gene Crawford
*Assistant Examiner*—Yolanda Cumbess
(74) *Attorney, Agent, or Firm*—Ostrolenk Faber LLP

(57) ABSTRACT

An electronic component conveying apparatus is provided in which an electronic component is accommodated in a through-hole of a conveyer table and is conveyed. The electronic component can be reliably picked up from the through-hole using a compressed gas in a short time. In addition, undesired exhaust of the electronic component due to a residual compressed air can be prevented, and the conveying efficiency can be increased. In an workpiece conveying apparatus, a first surface of a conveyer table includes a pressure relief groove that extends from a location at which the pressure relief groove overlaps with an exhaust hole in a direction crossing a conveying direction and communicates with a suction recess portion when the conveyer table is rotationally driven. Alternatively, the first surface includes a pressure relief hole for relieving pressure to the atmosphere.

6 Claims, 5 Drawing Sheets

FOREIGN PATENT DOCUMENTS

| | | |
|---|---|---|
| JP | 2002068471 | 8/2002 |
| JP | 2004226101 | 12/2004 |
| JP | 2006-27881 | 2/2006 |
| JP | 2006-36422 | 2/2006 |
| JP | 200627881 | 2/2006 |
| JP | 2006036422 | 9/2006 |

OTHER PUBLICATIONS

Written Opinion with English-language translation.
Office Action issued Sep. 23, 2009 in related U.S. Appl. No. 12/276,016.
Taiwanese Office Action and Search Report issued Apr. 20, 2010 in connection with corresponding Taiwan Patent Application No. 096118000.

\* cited by examiner

WORKPIECE TRANSPORTING APPARATUS AND ELECTRONIC COMPONENT TRANSPORTING APPARATUS

CROSS-REFERENCE TO RELATED APPLICATIONS

This is a continuation under 35 U.S.C. §111(a) of PCT/JP2007/059363 filed May 2, 2007, and claims priority of JP2006-154482 filed Jun. 2, 2006, both incorporated by reference.

This application is related to U.S. Ser. No. 12/246,079, filed Oct. 6, 2008, (P/1320-238), also incorporated by reference.

BACKGROUND

1. Technical Field

The present disclosure relates to a workpiece conveying apparatus for conveying a plurality of electronic components, such as chip electronic components, and in particular, to a workpiece conveying apparatus and an electronic component conveying apparatus for conveying a workpiece by moving, on a conveyer stage, a conveyer table having a plurality of through-holes formed therein, each of said through-holes serving as a container portion for a workpiece.

2. Background Art

In general, in order to manufacture chip electronic components, after chip electronic components are produced and the characteristics of the chip electronic components are measured, the chip electronic components are classified into a non-defective component group and a defective component group on the basis of the characteristics. In addition, the produced chip electronic components are categorized into a plurality of groups in accordance with the characteristics. In order to automate such operations and increase the productivity of manufacturing, different manufacturing equipments have been utilized for manufacturing the chip electronic components.

For example, in Patent Document 1 listed below, an example of such an electronic component conveying apparatus is described. In order to convey an electronic component, this electronic component conveying apparatus includes a disc-shaped conveyer table disposed so as to be in contact with a conveying surface of a table base. The disc-shaped conveyer table is connected to a rotation driving source so as to rotate about the center axis thereof. A plurality of through-holes each containing an electronic component sequentially supplied from a hopper are formed in the disc-shaped conveyer table along the periphery of the conveyer table. A hopper supplies an electronic component into each of the through-holes. Since the conveyer table rotates while sliding over the conveying surface of the base table, the electronic components are conveyed in the circumferential direction of the conveyer table.

While the electronic component is being conveyed in the circumferential direction of the conveyer table, the characteristics of the electronic component are measured. Subsequently, after the characteristics of the electronic component are measured, the electronic component is picked up from the through-hole by using appropriate electronic component pick-up means so as to be classified into a non-defective component group and a defective component group or classified into groups in accordance with the characteristics.

At that time, in order to maintain the proper orientation of the electronic component when the electronic component is conveyed, the conveying surface includes a suction recess portion formed therein. The suction recess portion communicates with the through-holes. The suction recess portion is connected to, for example, a suction vacuum source.

In addition, in order to pick up the electronic component after the characteristics of the electronic component are inspected, a structure as shown in FIG. 7 is employed. That is, as shown in FIG. 7, a conveyer table 102 of an electronic component conveying apparatus 101 includes a through-hole 102a. The through-hole 102a accommodates an electronic component 104. A surface 102b, one of two surfaces of the conveyer table 102, is in contact with a conveying surface 103a of a table base 103.

An exhaust hole 103b is open in the conveying surface 103a of the table base 103 at a location at which the electronic component 104 is picked up. The exhaust hole 103b extends from the conveying surface 103a to a surface 103c opposite the conveying surface 103a. In addition, the exhaust hole 103b is connected to a compressed air supply hose 105. The compressed air supply hose 105 is connected to a compressed air supply source, such as a compressor or a compressed-air cylinder.

When the electronic component 104 arrives at a location at which the electronic component 104 is picked up by rotation of the conveyer table 102 after the electronic component 104 is measured, the exhaust hole 103b faces part of the through-hole 102a. The exhaust hole 103b has a diameter smaller than that of the opening of the through-hole 102a. Subsequently, compressed air is ejected from the exhaust hole 103b. The pressure of the compressed air moves the electronic component 104 outside the through-hole 102a. Thus, the electronic component 104 is picked up.

In this way, the electronic component 104 is picked up without being subjected to mechanical shock. Accordingly, the occurrence of damage of the electronic component 104 can be reduced.

[Patent Document 1] Japanese Unexamined Patent Application Publication No. 2004-226101

As described above, the conveyer table 102 moves while sliding over the conveying surface 103a of the table base 103 independently from the table base 103. Accordingly, after the electronic component 104 is picked up using the compressed air, the conveyer table 102 further rotates. As a result, the exhaust hole 103b is closed by the surface 102b of the conveyer table 102 again.

In this case, no problems occur if the compressed air is completely discharged into the through-hole 102a, the electronic component 104 is picked up, and subsequently, the exhaust hole 103b is closed by the surface 102b of the conveyer table 102.

However, if the conveying speed is increased, the opening of the exhaust hole 103b may be closed by the conveyer table 102 with the compressed air remaining in the exhaust hole 103b. In such a case, since the compressed air remains in the exhaust hole 103b, residual pressure occurs.

Accordingly, when the conveyer table 102 further rotates so that the next through-hole, which accommodates an electronic component that should not be picked up at the above-described electronic component pick-up location, moves onto the exhaust hole 103b, the electronic component that should not be picked up may be picked up due to the residual pressure. Therefore, in the existing electronic component conveying apparatuses, in order to discharge the air completely, the conveyer table 102 should not be rotated and moved immediately after the electronic component 104 is picked up. For this reason, the conveyer table 102 needs to be stopped for a predetermined time period. That is, a stoppage time is needed for releasing the residual pressure and, therefore, the electronic component conveying apparatuses cannot operate at high speed.

In particular, as the size of an electronic component decreases, the size of the exhaust hole 103b needs to be decreased. Accordingly, since the small-sized exhaust hole 103b cannot discharge a sufficient amount of air, a longer stoppage time is needed for releasing the residual pressure. In addition, even when the stoppage time is increased, it is still difficult to sufficiently release the residual pressure.

SUMMARY

A first embodiment disclosed in of the present application provides a workpiece conveying apparatus including a conveyer stage having a conveying surface for conveying a workpiece, a conveyer table having a first surface facing the conveying surface of the conveyer stage and a second surface opposite the first surface, where the conveyer table includes through-holes that pass through the first and second surfaces. Driving means can be connected to the conveyer table and/or the conveyer stage so as to allow the conveyer table to move in sliding contact with the conveying surface with the first surface of the conveyer table facing the conveying surface of the conveyer stage. A suction unit, and a compressed gas supply unit can also be connected. The workpiece is conveyed by moving the conveyer table relative to the conveying surface with the workpiece disposed in one of the through-holes of the conveyer table. A suction recess portion extending in a conveying direction of the workpiece is formed in the conveying surface of the conveyer stage in order to hold the workpiece disposed in the through-hole by suction, and an exhaust hole for discharging compressed gas is formed in the conveying surface of the conveyer stage at a location at which the workpiece is picked up so as to be capable of overlapping with the through-hole in order to pick up the workpiece disposed in the through-hole. A suction groove extending in a direction crossing the conveying direction of the workpiece is formed in the first surface of the conveyer table so as to communicate with the through-hole, and the conveyer table moves while sliding on the conveying surface of the conveyer stage with the suction groove communicating with the suction recess portion formed in the conveying surface of the conveyer table. The suction unit is connected to the suction recess portion, and the compressed gas supply unit is connected to the exhaust hole. A pressure relief groove is formed in the first surface of the conveyer table at a location downstream of the through-hole having the workpiece disposed therein in the conveying direction, and the pressure relief groove extends from the location at which the pressure relief groove overlaps with the exhaust hole in a direction crossing the conveying direction so as to communicate with the suction recess portion when the conveyer table is moved.

In the first embodiment, it is desirable that a width of the pressure relief groove along the conveying direction is more than or equal to 50% of the distance between one of the through-holes and the next one of the through-holes located upstream of the one of the through-hole in the conveying direction. In such a case, since the width of the pressure relief groove along the conveying direction is sufficiently large, the compressed air can be discharged for a sufficiently long period of time, and therefore, the pressure is reliably relieved.

A second embodiment provides an electronic component conveying apparatus including a conveyer stage having a conveying surface for conveying a workpiece, a conveyer table having a first surface facing the conveying surface of the conveyer stage and a second surface opposite the first surface, where the conveyer table includes through-holes that pass through the first and second surfaces, driving means may be connected to the conveyer table and/or the conveyer stage so as to allow the conveyer table to move in sliding contact with the conveying surface of the conveyer stage with the first surface of the conveyer table facing the conveying surface of the conveyer stage. A suction unit, and a compressed gas supply unit may also be connected. The workpiece is conveyed by moving the conveyer table relative to the conveying surface with the workpiece disposed in one of the through-holes of the conveyer table. A suction recess portion extending in a conveying direction of the workpiece is formed in the conveying surface of the conveyer stage in order to hold the workpiece disposed in the through-hole by suction, and an exhaust hole for discharging compressed gas is formed in the conveying surface of the conveyer stage at a location at which the workpiece is picked up so as to be capable of overlapping with the through-hole in order to pick up the workpiece. A suction groove extending in a direction crossing the conveying direction of the workpiece is formed in the first surface of the conveyer table so as to communicate with the through-hole, and the conveyer table moves while sliding on the conveying surface of the conveyer stage with the suction groove communicating with the suction recess portion formed in the conveying surface of the conveyer table. A suction recess portion connected to the suction recess portion is provided. The suction unit is connected to the suction groove, and the compressed gas supply unit is connected to the exhaust hole. A pressure relief hole is disposed in the first surface of the conveyer table at a location downstream of the through-hole in the conveying direction and at which the pressure relief hole overlaps with the exhaust hole, and the pressure relief hole is open in the first surface, or another surface, so as to communicate with the atmosphere when the conveyer table is moved. Preferably the opening area of the pressure relief hole is equal to or greater than that of the opening area of the exhaust hole.

That is, in each of the first and second embodiments, pressure relief means that communicates with the suction recess portion is provided in order to relieve the residual pressure occurring in the exhaust hole.

The pressure relief hole may be an elongated slotted hole having a length extending in the conveying direction. The length of the slotted hole is more than or equal to 50% of the distance between one of the through-holes and the next one of the through-holes located upstream of the one of the through-holes in the conveying direction, and the width of the slotted hole in a direction perpendicular to the length direction of the slotted hole is smaller than the length of the smallest side among the external sides of the workpiece so that the workpiece does not enter the slotted hole. In such a case, since the pressure relief hole is a slotted hole and the length of the pressure relief hole is sufficiently large, the compressed gas can be discharged for a sufficiently long period of time. Accordingly, the pressure can be sufficiently relieved. In addition, since the width of the pressure relief hole is determined so that the workpiece does not enter the pressure relief hole, the workpiece does not accidentally enter the pressure relief hole. Alternatively, the pressure relief hole may be circular for example.

It is desirable that the pressure relief hole is formed so as to pass through the conveyer table from the first surface to the second surface. In such a case, the pressure relief hole can be easily formed in the conveyer table. In addition, compressed gas remaining in the exhaust hole after the compressed gas is discharged is rapidly released to the outside through the second surface of the conveyer table.

It is desirable that the conveyer table includes a center shaft, and the conveyer table is rotatably driven about the center shaft by the driving means so that the through-hole is moved in a circumferential direction of the conveyer table and the workpiece is conveyed in the circumferential direction of the conveyer table. In such a case, the conveyer table can have a disc shape, and therefore, an installation space required for a conveying path including the conveyer table for conveying electronic components can be reduced. As a result, the size of equipment including the electronic component conveying apparatus can be reduced.

In the electronic component conveying apparatuses according to the first and second embodiments, the conveyer table is disposed so as to face the conveying surface of the conveyer stage. Workpieces are disposed in the through-holes formed in the conveyer table, and the conveyer table is moved relative to the conveying surface. Thus, the workpieces are conveyed. Since the suction recess portion that communicates with the through-holes is formed in the conveying surface, desired orientations of electronic components can be maintained by suction.

Furthermore, in the first embodiment, the pressure relief groove is formed in the first surface of the conveyer table at a location downstream of the through-hole in the conveying direction, and the pressure relief groove extends from the location at which the pressure relief groove overlaps with the exhaust hole in a direction crossing the conveying direction so as to communicate with the suction recess portion when the conveyer table is moved. Accordingly, even when the exhaust hole is closed by the moving conveyer table and, therefore, residual pressure occurs after a workpiece accommodated in one of the through-holes is picked up by discharging compressed gas from the exhaust hole, the residual pressure can be relieved to the suction recess portion through the pressure relief groove when the pressure relief groove overlaps with the closed exhaust hole. Thus, the pressure in the exhaust hole can be relieved.

Consequently, accidental exhaust of the next electronic component from the through-hole due to residual pressure can be prevented. In addition, the conveying apparatus can reduce an extra stoppage time of the conveyer table. Alternatively, the conveying apparatus can move the conveyer table without requiring the stoppage time. As a result, the conveying efficiency of the electronic component conveying apparatus can be increased.

Similarly, in the second embodiment, the pressure relief hole that is open in the first surface of the conveyer table and that communicates with the atmosphere is formed in place of the pressure relief groove of the first invention. The pressure relief hole is disposed downstream of the through-hole in the conveying direction so as to overlap with the exhaust hole when the conveyer table is moved. Accordingly, even when the exhaust hole is closed by the moving conveyer table and, therefore, residual pressure occurs after a workpiece accommodated in one of the through-holes is picked up by discharging compressed gas from the exhaust hole, the residual pressure can be relieved from the pressure relief hole when the pressure relief hole is moved at a location at which the pressure relief hole overlaps with the exhaust hole. Thus, the residual pressure can be rapidly relieved through the pressure relief hole.

Consequently, according to the second embodiment, undesired exhaust of an electronic component due to residual pressure can be prevented. In addition, the conveying efficiency of the electronic component conveying apparatus can be increased.

Other features and advantages will become apparent from the following description of embodiments, which refers to the accompanying drawings.

DETAILED DESCRIPTION

Figure 1A:
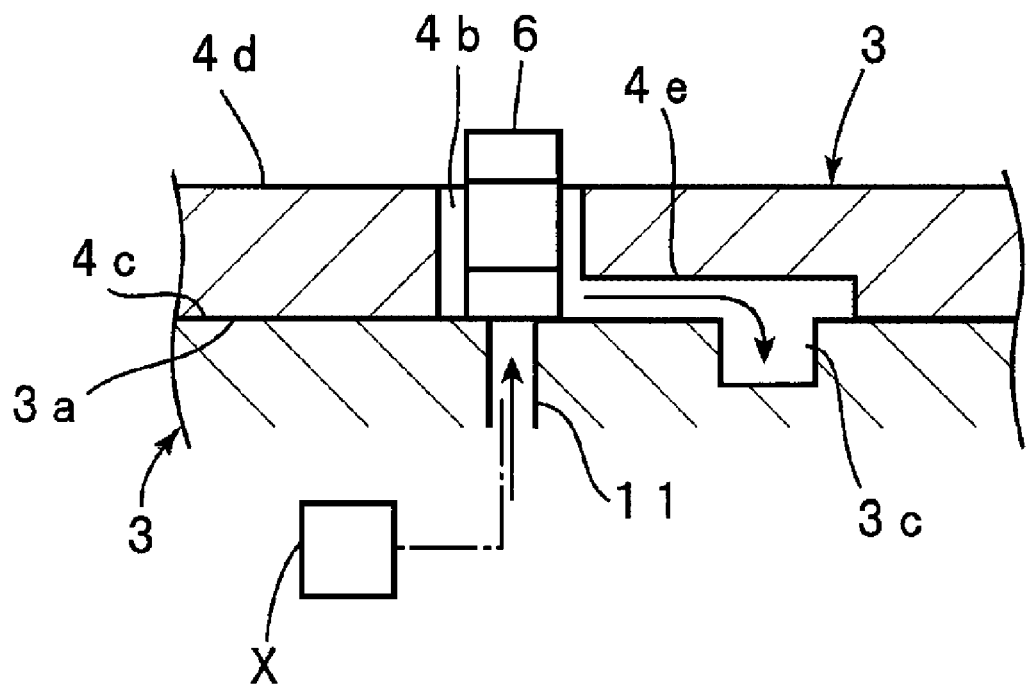
FIGS. 1(*a*) and 1(*b*) are, respectively, a partial cut-away cross-sectional view and a schematic plan view illustrating the structure of a portion of a workpiece conveying apparatus for picking up an electronic component serving as a workpiece using compressed air according to a first embodiment.

Reference Numerals 1 electronic component conveying apparatus
2 base plate
3 conveyer stage
3*a* conveying surface
3*b*, 3*c*, 3*d* suction recess portion
4 conveyer table
4*a* center shaft
4*b* through-hole
4*c* first surface
4*d* second surface
4*e* suction groove
4*f* pressure relief groove
4*g* pressure relief hole
4*h* pressure relief hole
5 driving unit
6 electronic component
7 electronic component supply unit
8 characteristic measuring unit
9 pickup unit
10 suction source
11 exhaust hole
11*a* opening Exemplary embodiments are described below in connection with the accompanying drawings.

FIGS. 3(*a*) and 3(*b*) are, respectively, a schematic front view of an electronic component conveying apparatus, and a schematic front view of the electronic component conveying apparatus with the conveyer table (described below) removed.

An electronic component conveying apparatus 1 includes a base plate 2. In the present embodiment, the base plate 2 is disposed so as to extend vertically in the mounted space. However, the base plate 2 may be inclined from the vertical direction or may be disposed so as to extend horizontally.

A conveyer stage 3 is disposed on a surface 2a of the base plate 2. In the present embodiment, the conveyer stage 3 is formed from a plate having a disc shape. However, the conveyer stage 3 may be formed from a plate having another shape, such as a rectangular shape. The conveyer stage 3 is fixed to the base plate 2. The conveyer plate 3 has a conveying surface 3a remote from the base plate 2.

A conveyer table 4 is disposed on the conveying surface 3a. The conveyer table 4 has a disc shape. The conveyer table 4 is disposed so as to be rotatable about a center shaft 4a. The center shaft 4a is connected to a driving unit 5, which is schematically shown in the drawing. The conveyer table 4 is rotatably moved by the driving unit 5 in a clockwise direction.

In the present embodiment, the conveyer table 4 is rotated about the center shaft 4a in the clockwise direction. However, the conveyer table 4 may be fixed, and the conveyer stage 3 may be rotated about the center shaft. Alternatively, the conveyer stage 3 and the conveyer table 4 may be rotated about the center shaft 4a at different speeds or in opposite directions.

That is, any structure in which the conveyer table 4 moves relative to the conveying surface 3a of the conveyer stage 3 can be employed.

The conveyer table 4 is formed from a hard material, such as a metal or a synthetic resin. A plurality of through-holes 4b are formed and arranged in the vicinity of the outer periphery of the conveyer table 4 in the circumferential direction. Each of the through-holes 4b functions as a container that accommodates an electronic component serving as a workpiece. In the present embodiment, two lines of the plurality of through-holes 4b are formed in the circumferential direction.

However, it should be noted that the number of lines of the through-holes 4b is not limited to a particular number. The plurality of through-holes 4b may be arranged in one line or three lines or more.

Figure 3A:
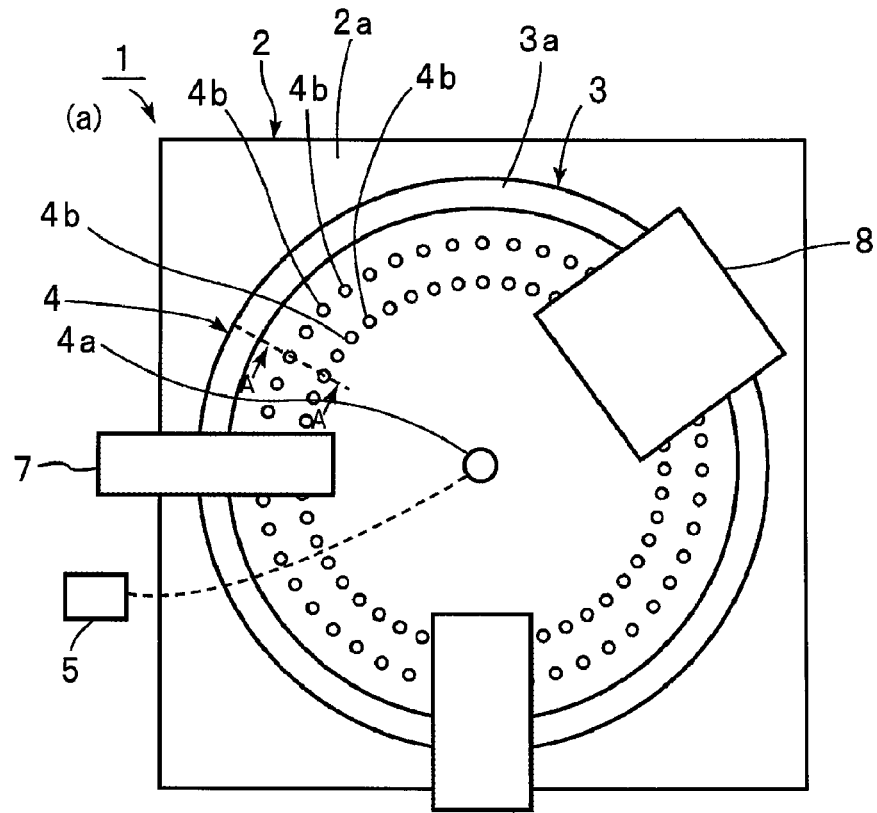
FIG. 3(*a*) is a front view of an electronic component conveying apparatus according to an embodiment, and FIG. 3(*b*) is a front view illustrating a suction groove formed in a conveying surface.
Figure 4:
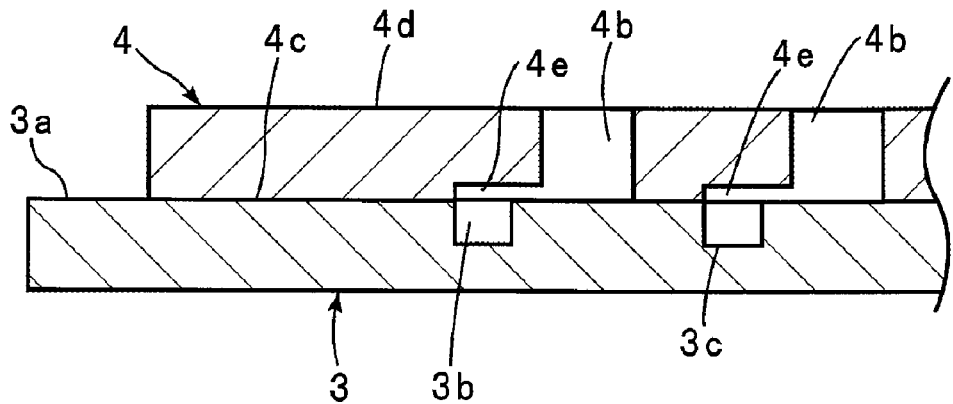
FIG. 4 is an enlarged side cross-sectional view of a portion extending along a line A-A of FIG. 3(*a*).

FIG. 4 is a partially cut-away cross-sectional view taken along a line A-A of FIG. 3(a). As can be seen from FIG. 4, the conveyer table 4 includes a first surface 4c that is in contact with the conveying surface 3a of the conveyer stage 3 or that is disposed so as to be close to the conveying surface 3a and a second surface 4d opposite the first surface 4c. The through-holes 4b extend from the first surface 4c to the second surface 4d. An opening portion of each of the through-holes 4b in the second surface 4d has a size so that an electronic component 6 can be inserted in the through-hole 4b.

In the present embodiment, the opening portion of each of the through-holes 4b in the second surface 4d is circular.

Referring back to FIG. 3(a), an electronic component is inserted into the through-hole 4b through the second surface 4d of the conveyer table 4 by an electronic component supply unit 7. A hopper or another suitable unit can be used for the electronic component supply unit 7. That is, the electronic component supply unit 7 is not limited to any particular unit.

As the conveyer table 4 is rotated in the clockwise direction, the conveyer table 4 moves such that the first surface 4c of the conveyer table 4 moves while sliding over the conveying surface 3a of the conveyer stage 3. Accordingly, the electronic component 6 accommodated in the through-hole 4b is conveyed in the circumferential direction of the conveyer table 4. A characteristic measuring unit 8 is disposed in the conveying path. The characteristic measuring unit 8 includes, for example, a plurality of probes in contact with electrodes of the electronic component so as to measure the electrical characteristics of the electronic component 6. In accordance with the measured result, the electronic component is classified into a non-defective component group or a defective component group. Alternatively, the electronic component is classified into some groups in accordance with the values of characteristics.

A variety of electrical measuring equipment can be used for the characteristic measuring unit 8 in accordance with a characteristic to be measured.

Figure 3B:
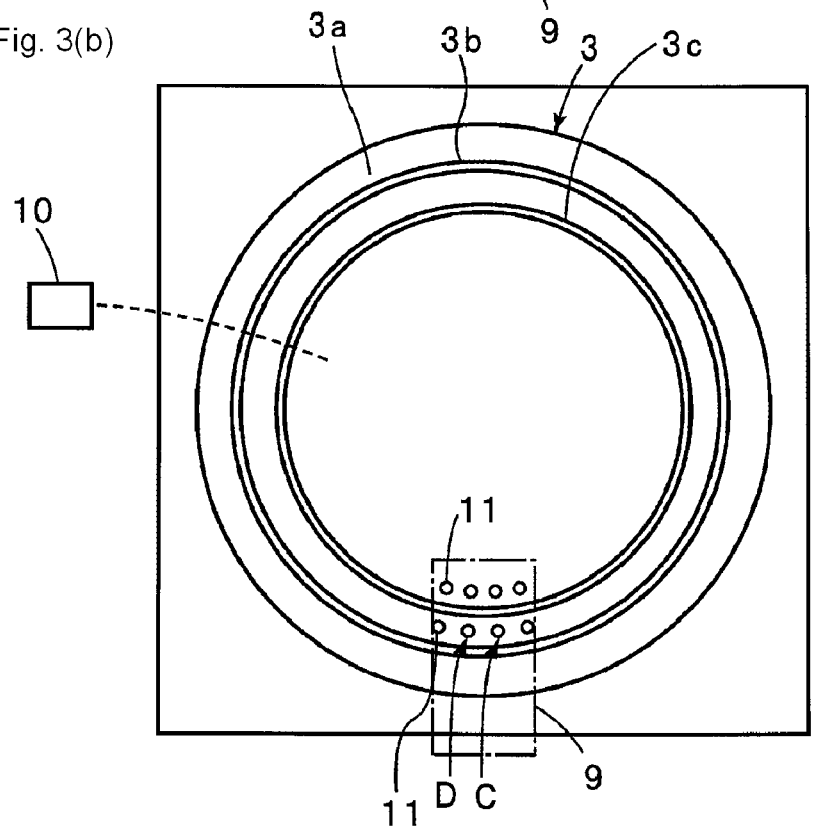

FIG. 3(b) illustrates a state in which the conveyer table 4 is removed, and the conveying surface 3a of the conveyer stage 3 is exposed. As shown in FIG. 3(b), the conveying surface 3a includes two suction recess portions 3b and 3c formed therein in a concentric pattern. The suction recess portions 3b and 3c are disposed so as to communicate with part of each of the through-holes 4b of the conveyer table 4 through a suction groove described below. Since the plurality of through-holes are arranged in two lines in the circumferential direction, two suction recess portions 3b and 3c are disposed in a concentric pattern. That is, the suction recess portion 3b, one of the suction recess portions, is located outside the outer line of the two lines of the through-holes 4b in the radial direction. The suction recess portion 3c is located outside the smaller diameter inner line of the two lines of the through-holes 4b in the radial direction. The suction recess portion 3b is connected to each of the through-holes 4b in the outer line via a suction groove described below. The inner suction recess portion 3c is connected to each of the through-holes 4b in the inner line via a suction groove described below. As shown in FIG. 3(b), the suction recess portions 3b and 3c are connected to a suction source 10, such as a vacuum suction source.

As shown in FIG. 4, each of the through-holes 4b communicates with one of suction grooves 4e extending in the first surface 4c in the radial direction of the conveyer table 4. Each of the suction grooves 4e is disposed so that part of the suction groove 4e overlaps with the suction recess portion 3b or the suction recess portion 3c.

Accordingly, by sucking in air through the suction recess portions 3b and 3c using the suction source 10, the electronic component is held and located in place in the through-hole 4b due to a negative pressure.

On the other hand, as shown in FIG. 3(b), in an electronic component pickup unit 9, a plurality of exhaust holes 11 are open in the conveying surface 3a.

Figure 1B:
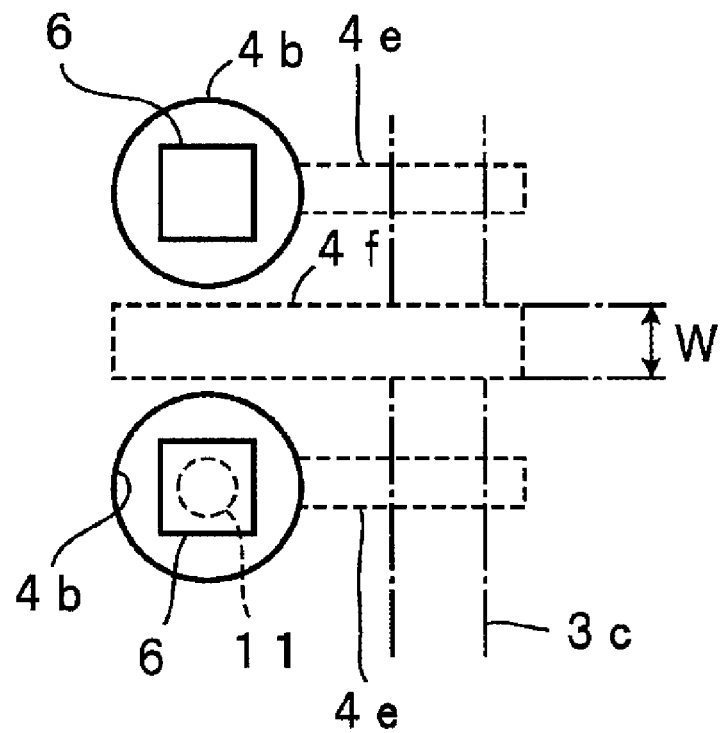

FIGS. 1(a) and 1(b) are, respectively, a partial cut-away cross-sectional view and a schematic plan view illustrating a structure for picking up the electronic component 9 at a workpiece pickup position.

Figure 2A:
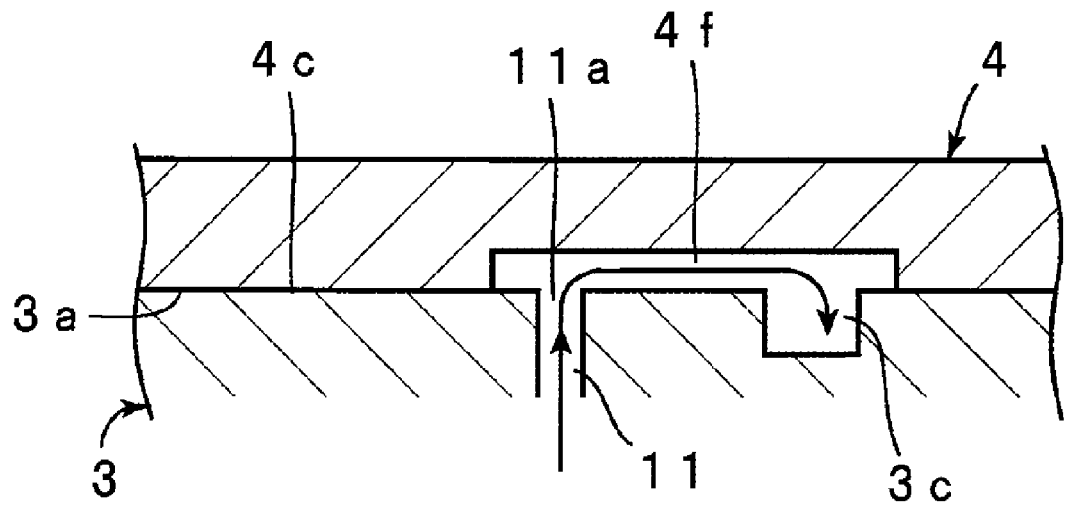
FIGS. 2(*a*) and 2(*b*) are, respectively, a partial cut-away cross-sectional view and a schematic plan view illustrating a portion of the workpiece conveying apparatus in which a pressure relief groove for relieving residual pressure in an exhaust hole communicates with a suction recess portion, according to the first embodiment.
Figure 2B:
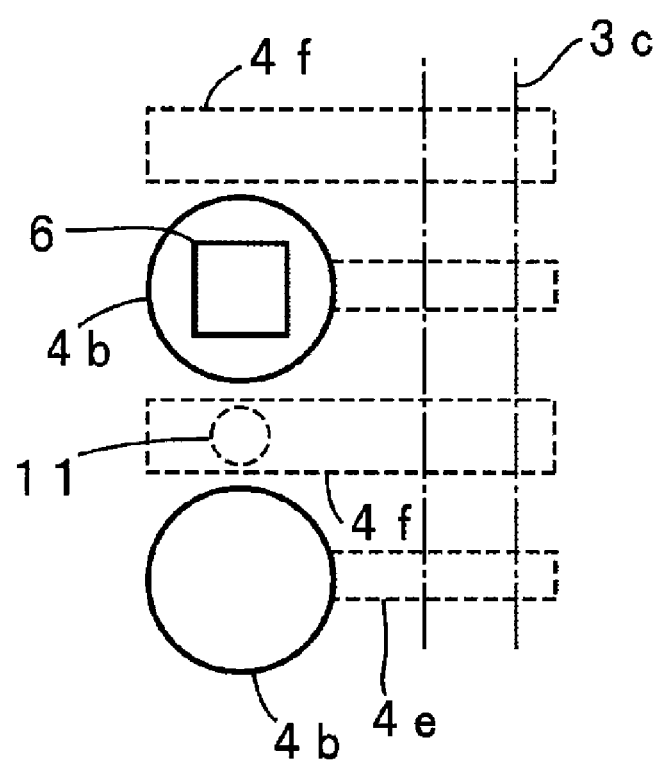

As shown in FIG. 2(b), the plurality of exhaust holes 11 are disposed in the conveying surface 3a of the conveyer stage 3 so as to be adjacent to the ring-shaped suction recess portions 3b and 3c at positions corresponding to the workpiece pickup positions 9. The exhaust holes 11 are arranged so as to extend in the circumferential direction. FIG. 1(a) is a cross-sectional view of a portion including one of the exhaust holes 11.

Each of the exhaust holes 11 is connected to a compressed-air supply source X and is formed so as to allow compressed air to discharge from an opening 11a of the exhaust hole 11.

In addition, the exhaust holes 11 are disposed at locations at which the through-holes 4b overlap with the exhaust holes 11 when the conveyer table 4 is rotatably driven about the center shaft 4a by the driving unit 5 in the clockwise direction. FIG. 1(b) illustrates the case where one of the through-holes 4b overlaps one of the exhaust holes 11. As described above, the through-hole 4b accommodates the electronic component 6. As shown in FIG. 1(a), the suction groove 4e is formed so as to communicate with the through-hole 4b. As noted above, the end portion of the suction groove 4e remote from the through-hole 4b overlaps with the suction recess portion 3c. Accordingly, the proper orientation of the electronic component 6 is maintained using an air suction force while the electronic component 6 is being conveyed.

In contrast, as shown in FIG. 1(a), when the through-hole 4b reaches the location at which the electronic component 6 is picked up, the through-hole 4b overlaps with the exhaust hole 11. By discharging compressed air from the exhaust hole 11, the electronic component 6 can be picked up from the through-hole 4b.

As shown in FIG. 1(b), a pressure relief groove 4f is disposed on the first surface 4c of the conveyer table 4 upstream of one of the through-holes 4b. As shown in FIGS. 2(a) and 2(b), when the conveyer table 4 is further rotated so that the pressure relief groove 4f reaches a location at which the pressure relief groove 4f overlaps with the above-described exhaust hole 11, the pressure relief groove 4f causes the opening 11a of the exhaust hole 11 to communicate with the suction recess portion 3c. That is, as shown in FIG. 1(b) and FIGS. 2(a) and 2(b), the pressure relief groove 4f extends in a direction crossing the conveying direction of the electronic component 6 so as to overlap with both the exhaust hole 11 and the suction recess portion 3c when the conveyer table 3 is rotatably driven. At that time, the pressure relief groove 4f communicates with the suction recess portion 3c.

As shown in FIG. 1(b), one of the pressure relief grooves 4f is disposed upstream of the through-hole 4b that accommodates the electronic component 6. And another one of the pressure relief grooves 4f is disposed upstream of the subsequent through-hole located upstream of the through-hole 4b. That is, as shown in FIG. 2(b), the pressure relief groove 4f is disposed upstream of one of the through-holes 4b and downstream of the next through-hole 4b. Since the pressure relief groove 4f is provided, residual pressure can be relieved through the pressure relief groove 4f even when the exhaust hole 11 is closed by the conveyer table 4 after the electronic component 6 is picked up by discharging compressed air from the exhaust hole 11 to the through-hole 4b. Thus, an adverse effect caused by residual pressure can be prevented.

It is desirable that a width W of the pressure relief groove 4f in the conveying direction is more than or equal to 50% of the distance between one of the through-holes 4b and the next one of the through-holes 4b located upstream therefrom in the conveying direction. Under such a condition, since the width W of the pressure relief groove 4f in the conveying direction is sufficiently large, the compressed air can be discharged for a sufficient period of time. Therefore, an adverse effect caused by residual pressure can be further reliably prevented.

In the present embodiment, the plurality of the through-holes 4b are arranged in the circumferential direction of the conveyer table 4. In addition, the plurality of the through-holes 4b are arranged in two lines in the circumferential direction. Furthermore, the pressure relief groove 4f is disposed upstream of each of the through-holes 4b arranged in one of the lines. Similarly, a pressure relief groove is disposed upstream of each of the through-holes 4b arranged in the other line. This pressure relief groove is disposed so as to extend to a location at which the pressure relief groove overlaps with the suction recess portion 3d.

In this way, residual pressure can also be relieved to the suction recess portion 3d by means of the pressure relief groove formed for the other line. Therefore, an adverse effect caused by the residual pressure can be prevented.

The operation of the electronic component conveying apparatus according to the present embodiment is described below.

As shown in FIG. 3(a), in order to convey electronic components while testing the characteristics of the electronic components using the electronic component conveying apparatus 1, a plurality of the electronic components are sequentially inserted from the electronic component supply unit 7 into the through-holes 4b of the conveyer table 4. Thereafter, the conveyer table 4 is driven by the driving unit 5 and is rotated in the clockwise direction. As a result, the electronic components 6 accommodated in the through-holes 4b are conveyed in the circumferential direction of the conveyer table 4 and in the clockwise direction. At that time, by sucking out air from the suction recess portions 3b and 3c, the electronic components 6 are conveyed while maintaining their proper orientations in the through-holes 4b.

Subsequently, the characteristic measuring unit 8 measures the characteristics of the conveyed electronic components 6 and determines whether the electronic components 6 are non-defective or defective in accordance with the measured characteristics. That is, when picking up the electronic components, the electronic component pickup unit 9 determines that only a non-defective electronic component is picked up at a predetermined location and a defective electronic component is picked up at another predetermined location or that the electronic components are picked up at a plurality of different locations in accordance with the values of characteristics. In this way, the electronic component pickup unit 9 picks up the electronic components at predetermined locations in accordance with the measured values of characteristics. This control can be achieved by connecting control means to the electronic component conveying apparatus and driving the electronic component pickup unit 9 in accordance with a measured value obtained from the characteristic measuring unit 8.

As described above, the location at which the electronic component is picked up is determined. Thereafter, when the electronic component 6 to be picked up is rotated by the conveyer table 4 and reaches a position above the exhaust hole 11 disposed at the location at which the electronic component 6 is picked up, the exhaust hole 11 discharges compressed air. In this way, the electronic component 6 can be picked up.

Subsequently, the conveyer table 4 is further rotated. After the through-hole 4b moves over the exhaust hole 11, the exhaust hole 11 is closed by the first surface 4c of the conveyer table 4. At that time, if the compressed air remains in the exhaust hole 11, residual pressure occurs in a flow path.

In the existing conveying apparatus, this residual pressure may accidentally eject the electronic component 6 that is subsequently conveyed, although that location is not a location at which the electronic component 6 is picked up. In contrast, according to the present embodiment, the workpiece conveying apparatus 1 can reliably prevent such an adverse effect of the residual pressure.

That is, even when the residual pressure remains in the exhaust hole 11, the pressure relief groove 4f subsequently arrives at a position above the exhaust hole 11 in which the residual pressure occurs. At that time, as shown in FIG. 2(b), the pressure relief groove 4f allows the exhaust hole 11 to communicate with the suction recess portion 3c. Accordingly, the compressed air remaining in the exhaust hole 11 is sucked through the pressure relief groove 4f, and therefore, the residual pressure disappears.

Consequently, even when the rotation of the conveyer table 4 moves the next electronic component 6 that should not be picked up to the position above the exhaust hole 11, exhaust of the electronic component 6 can be prevented, since the residual pressure is removed from the exhaust hole 11.

As noted above, according to the present embodiment, since the workpiece conveying apparatus 1 includes the pressure relief groove 4f, undesired pickup of the electronic component due to a residual pressure can be reliably prevented even when the residual pressure occurs in the exhaust hole 11.

That is, the need for a complicated structure in which conveyance of the conveyer table 4 is stopped and compressed air is removed from the exhaust hole 11 during the stoppage is eliminated. Accordingly, the conveying efficiency of the workpiece conveying apparatus 1 can be significantly increased.

Figure 5A:
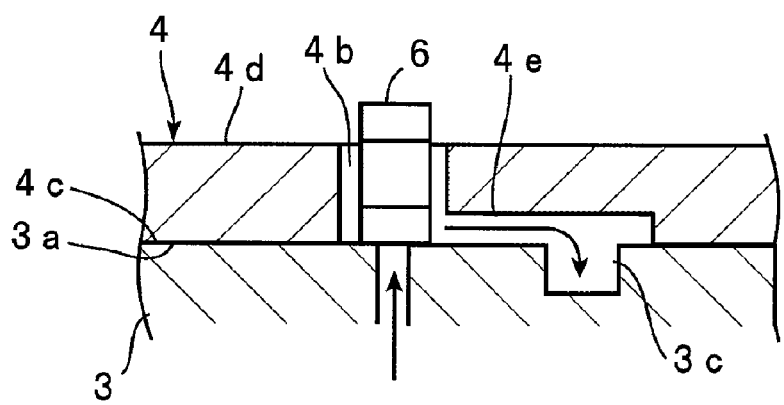
FIGS. 5(*a*) and 5(*b*) are, respectively, a partial cut-away cross-sectional view and a schematic plan view illustrating the structure of a workpiece conveying apparatus in which an electronic component serving as a workpiece is picked up at a workpiece pickup location according to a second embodiment.
Figure 5B:
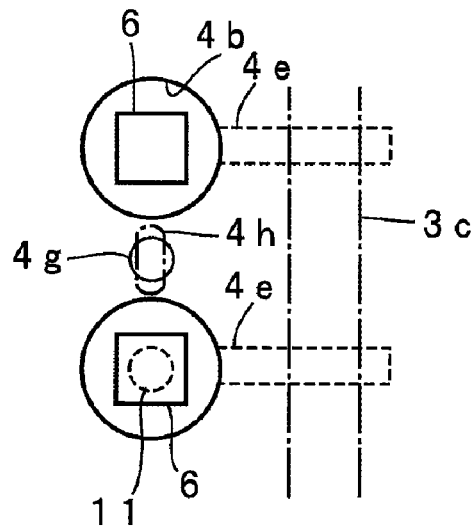

FIGS. 5(a) and 5(b) are, respectively, a partially cut-away side cross-sectional view and a schematic front cross-sectional view of a main portion of a workpiece conveying apparatus according to a second embodiment. FIGS. 5(a) and 5(b) correspond to FIGS. 1(a) and 1(b), respectively.

Figure 6:
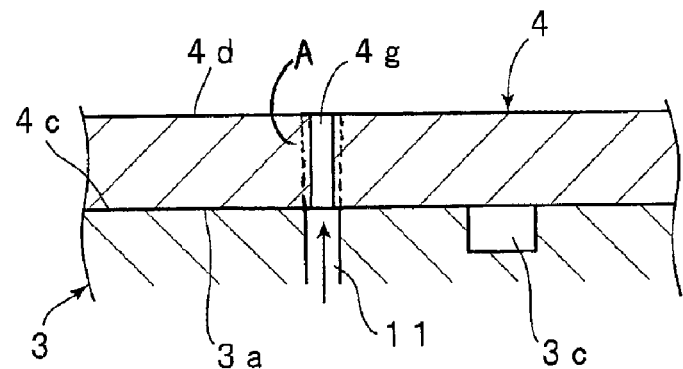
FIG. 6 is a partial cut-away cross-sectional view of a portion in which a pressure relief hole overlaps with an exhaust hole according to the second embodiment.
Figure 7:
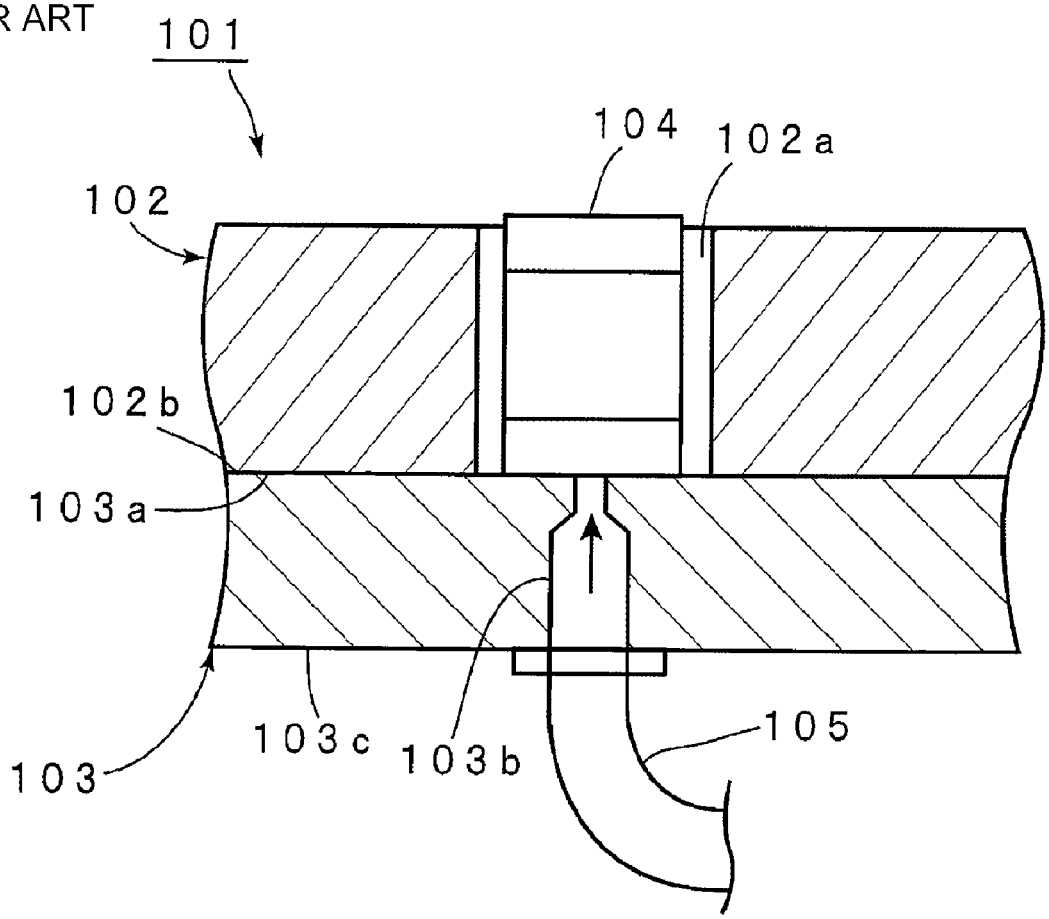
FIG. 7 is a schematic front cross-sectional view of a portion of an existing electronic component conveying apparatus in which an electronic component is picked up.

According to the first embodiment, the pressure relief groove 4f is provided in order to relieve the residual pressure. However, according to the second embodiment, a pressure relief hole 4g is provided in a conveyer table 4 in place of the pressure relief groove 4f. That is, FIG. 6 is a plan view of a portion in which the pressure relief hole 4g is provided in place of the pressure relief groove 4f in the workpiece conveying apparatus 1 according to the second embodiment. The other structures are similar to those of the first embodiment. Accordingly, descriptions thereof are not repeated.

The pressure relief hole 4g is disposed upstream of one of exhaust holes 11 provided at a location at which a workpiece is picked up and downstream of the next one of the exhaust holes 11. After an electronic component 6 shown in FIG. 5(a) is picked up using compressed air discharged from the exhaust hole 11, the conveyer table 4 is rotationally driven. As a result, as shown in FIG. 6, the pressure relief hole 4g overlaps with the exhaust hole 11 by which the electronic component 6 was picked up as shown in FIG. 5(b). The pressure relief hole 4g passes through the conveyer table 4, from the first surface 4c to the second surface 4d. That is, the pressure relief hole 4g is a through-hole.

As described above, the pressure relief hole 4g passes through the conveyer table 4. Accordingly, when the pressure relief hole 4g overlaps with the exhaust hole 11, the exhaust hole 11 is open to the atmosphere. Therefore, even when a residual pressure occurs in the exhaust hole 11, the residual pressure rapidly disappears.

That is, as indicated by the second embodiment, in order to expose the exhaust hole 11 to the atmosphere, the pressure relief hole 4g may be provided in place of the pressure relief groove 4f.

Note that, in the second embodiment, the pressure relief hole 4g is also disposed upstream of each of the through-holes 4b, that is, the pressure relief hole 4g is disposed upstream of one of the through-holes 4b and downstream of the next one of the through-holes 4b.

As shown with a broken line A, it is desirable that the opening area of the pressure relief hole 4g is larger than or equal to the opening area of the exhaust hole 11. This allows the exhaust hole 11 to rapidly open to the atmosphere.

According to the second embodiment, since the pressure relief hole 4g can be formed merely by drilling a through-hole in the conveyer table 4, formation of the pressure relief hole 4g can be easier than that of the pressure relief groove 4f of the first embodiment. It should be noted that the pressure relief hole 4g is not limited to the through-hole formed in the conveyer table 4 in the above-described manner. For example, one opening end of the pressure relief hole 4g may be formed in the first surface 4c of the conveyer table 4, and the other opening end may be formed in the side surface of the conveyer table 4 and communicates with the atmosphere.

While the second embodiment has been described with reference to the circular pressure relief hole 4g, a slotted pressure relief hole 4h may be formed, as indicated by an alternate long and short dash line in FIG. 5(b). It is desirable that the slotted pressure relief hole 4h is disposed so that the length direction of the slotted pressure relief hole 4h is the conveying direction, and the length of the pressure relief hole 4h in the conveying direction is more than or equal to 50% of the distance between one of the through-holes 4b and the next one of the through-holes 4b located upstream of the one of the through-holes 4b in the conveying direction. In this case, since the length of the pressure relief hole 4h in the conveying direction is sufficiently large, pressure can be relieved for a sufficient period of time. Therefore, an adverse effect caused by a residual pressure can be further reliably prevented. It is more desirable that the width of slotted pressure relief hole 4h, that is, the dimension in a direction perpendicular to the conveying direction is set to a value that prevents the workpiece 6 from entering the pressure relief hole 4h. That is, it is more desirable that the width of the slotted pressure relief hole 4h is smaller than the length of the smallest side among the external sides of the workpiece. Thus, the workpiece 6 does not enter the pressure relief hole 4h, and therefore, the workpiece 6 is not accommodated in the pressure relief hole 4h.

While the above-described embodiments have been described with reference to a conveyer table having a disc shape and rotatably driven about the center shaft 4a in the clockwise direction, the shape of the conveyer table is not limited to a disc shape. In addition, the conveying path may be determined so that the conveyer table is moved in a direction other than a circumferential direction, such as in a line direction, and a through-hole formed in the conveyer table is moved in that direction. That is, the operation of a workpiece conveying apparatus is not limited to rotating of a disc-shaped conveyer table relative to a conveying surface of a conveyer stage.

While the above-described electronic component conveying apparatus has conveyed an electronic component serving as a workpiece, the electronic component conveying apparatus may be used for conveying a workpiece other than an electronic component.

In addition, while the foregoing embodiments have been described with reference to use of compressed air for compressed gas, other inactive gas, such as nitrogen gas, may be employed.

Although particular embodiments have been described, many other variations and modifications and other uses will become apparent to those skilled in the art. Therefore, the present invention is not limited by the specific disclosure herein.

What is claimed is:

1. A workpiece conveying apparatus comprising:
   a conveyer stage having a conveying surface for conveying a workpiece;
   a conveyer table having a first surface facing the conveying surface of the conveyer stage and a second surface opposite the first surface, the conveyer table including through-holes that pass through the first and second surfaces;

first means connected to the conveyer table and/or the conveyer stage for receiving a driving force so as to allow the conveyer table to move in sliding contact with the conveying surface of the conveyer stage with the first surface of the conveyer table facing the conveying surface of the conveyer stage;

wherein the workpiece is conveyed by moving the conveyer table relative to the conveying surface with the workpiece disposed in one of the through-holes of the conveyer table, wherein a suction recess portion extending in a conveying direction of the workpiece is formed in the conveying surface of the conveyer stage in order to hold the workpiece disposed in the through-hole by suction, and an exhaust hole for discharging compressed gas when the workpiece to be picked up is conveyed, is formed in the conveying surface of the conveyer stage at a location at which the workpiece is picked up so as to be capable of overlapping with the through-hole in order to pick up the workpiece, and wherein a suction groove extending in a direction crossing the conveying direction of the workpiece is formed in the first surface of the conveyer table so as to communicate with the through-hole, and the conveyer table moves while sliding on the conveying surface of the conveyer stage with the suction groove communicating with the suction recess portion formed in the conveying surface of the conveyer table;

second means for connecting a suction unit to the suction recess portion; and third means for connecting a compressed gas supply unit to the exhaust hole;

wherein a pressure relief hole is provided in the conveyer table at a location downstream of the through-hole in the conveying direction and at which the pressure relief hole overlaps with the exhaust hole, and the pressure relief hole is open in the first surface of the conveyer table so as to communicate with the atmosphere when the conveyer table is moved.

2. The workpiece conveying apparatus according to claim 1, wherein the pressure relief hole is a slotted hole having a length extending in the conveying direction, and the length of the slotted hole is more than or equal to 50% of the distance between one of the through-holes and the next one of the through-holes located upstream of the one of the through-holes in the conveying direction, and wherein the width of the slotted hole in a direction perpendicular to the length direction of the slotted hole is smaller than the length of the smallest side among the external sides of the workpiece so that the workpiece does not enter the slotted hole.

3. The workpiece conveying apparatus according to claim 1, wherein the pressure relief hole is formed so as to pass through the conveyer table from the first surface to the second surface.

4. The workpiece conveying apparatus according to claim 1 or 2, wherein an opening area of the pressure relief hole is equal to an opening area of the exhaust hole.

5. The workpiece conveying apparatus according to claim 4, wherein the pressure relief hole is formed so as to pass through the conveyer table from the first surface to the second surface.

6. The workpiece conveying apparatus according to claim 1, wherein the conveyer table includes a center shaft, and wherein the conveyer table is rotatably driven about the center shaft by the first means so that the through-hole is moved in a circumferential direction of the conveyer table and the workpiece is conveyed in the circumferential direction of the conveyer table.

* * * * *